(12) United States Patent
Gauggel et al.

(10) Patent No.: US 8,247,252 B2
(45) Date of Patent: Aug. 21, 2012

(54) HIGH POWER TOP EMITTING VERTICAL CAVITY SURFACE EMITTING LASER

(75) Inventors: Hans-Peter Gauggel, Winterthur (CH); Paul Royo, Geneva (CH)

(73) Assignee: Oclaro Technology Limited, Northamptonshire (GB)

( * ) Notice: Subject to any disclaimer, the term of this patent is extended or adjusted under 35 U.S.C. 154(b) by 101 days.

(21) Appl. No.: 12/587,753

(22) Filed: Oct. 13, 2009

(65) Prior Publication Data

US 2010/0035372 A1 Feb. 11, 2010

Related U.S. Application Data

(62) Division of application No. 10/569,059, filed as application No. PCT/EP2004/009657 on Aug. 30, 2004, now abandoned.

(30) Foreign Application Priority Data

Sep. 1, 2003 (EP) .................................... 03019870

(51) Int. Cl.
*H01L 21/00* (2006.01)
(52) U.S. Cl. ..................... 438/34; 257/E21.211; 257/88
(58) Field of Classification Search .............. 438/14–18, 438/34; 257/E21.521–E21.531, 88, 21.211
See application file for complete search history.

(56) References Cited

U.S. PATENT DOCUMENTS

| | | | |
|---|---|---|---|
| 5,325,386 A | 6/1994 | Jewell et al. | 372/50 |
| 5,446,754 A | 8/1995 | Jewell et al. | 372/50 |
| 5,513,195 A | 4/1996 | Opower et al. | 372/18 |
| 5,574,738 A | 11/1996 | Morgan | 372/28 |
| 5,625,636 A | 4/1997 | Bryan et al. | 372/50 |
| 5,903,589 A | 5/1999 | Jewell | 372/46 |
| 5,907,572 A | 5/1999 | Yamamoto et al. | 372/50 |

FOREIGN PATENT DOCUMENTS

EP 0 905 838 A1 3/1999

OTHER PUBLICATIONS

Huffaker et al. ("Native-Oxide defined ring contact for low threshold vertical-cavity lasers", Applied Physics Letters, 65 (1), Jul. 4, 1994).*
Chua et al, Low-threshold InAlGaAs vertical-cavity surface-emitting laser arrays using transparent contacts, 1998, Applied Physics Letters, American Institute of Physics, V. 72, No. 9, pp. 1001-1003.

(Continued)

*Primary Examiner* — Julio J Maldonado
*Assistant Examiner* — Sonya McCall Shepard
(74) *Attorney, Agent, or Firm* — Patterson & Sheridan, L.L.P.

(57) ABSTRACT

A method of adjusting a power density in a laser device including a VCSEL array providing an increased power density at a high wall-plug efficiency in that the lateral design parameters are appropriately selected on the basis of a relationship that has been established for a specified vertical design, a corresponding process technology and specified operating conditions. Thus, the total output power, the power density, and the efficiency may be optimized independently from other design criteria and application requirements by tuning only the lateral size of the individual VCSEL elements and the pitch of nearest neighbors of the elements within the array. Hence, for a lateral size of less than 30 μm and a pitch of less than 80 μm, a highly efficient VCSEL array can be provided with a high power density, thereby optimizing manufacturing costs for the output power per chip area.

9 Claims, 10 Drawing Sheets

OTHER PUBLICATIONS

Chua et al, Independently addressable VCSEL arrays on 3-µM pitch, 1998, IEEE Photonics Technology Letters, IEEE, V. 10, No. 7, pp. 917-919.

Grabherr et al High-power VCSEL's single device and dentsely packed 2-D arrays, 1999, IEE Journal of Selected Topics in Quantum Electronics, IEEE, V. 5, No. 3, pp. 495-502.

* cited by examiner

HIGH POWER TOP EMITTING VERTICAL CAVITY SURFACE EMITTING LASER

RELATED APPLICATIONS

This application is a divisional of U.S. application Ser. No. 10/569,059, now abandoned which is the National Stage of International Application No. PCT/EP2004/009657, filed Aug. 30, 2004, which is herein incorporated by reference.

FIELD OF THE INVENTION

The present invention generally relates to a laser device including a plurality of vertical cavity surface emitting laser (VCSEL) elements, which are provided in a single chip so as to increase the total output power of the laser device compared to a single VCSEL.

BACKGROUND OF THE INVENTION

VCSEL devices are considered an attractive alternative to conventional edge-emitting laser diodes due to their small size and their potential of being formed in a substantially circular symmetry. Generally, VCSEL devices show a relatively low threshold current, a high modulation efficiency and, if designed so as to emit a substantially circular beam profile, allow to be coupled into optical fibers in a simple fashion. Additionally, the manufacture of VCSEL devices comes along with a parallel and cost-effective production, testing and packaging process, and also offers the possibility of being packed in one and two-dimensional arrays to comply with a plurality of applications such as data communication, sensing applications, and the like.

In other applications, such as laser pumping, free space communication, illumination systems, or other high-power applications, a laser device not only requires a high total output power in the range of several hundred milliwatts, but also necessitates a high output power per chip area to reduce the required chip area and hence the costs per watt output power. In addition, a high wall-plug efficiency is required to keep thermal losses and the requirements on the packaging side low. Consequently, the output power per chip area or the power density and the wall-plug efficiency represent important parameters that may be decisive for the success of VCSELs in such high power applications. Moreover, the wavelength required for specific high power applications may range from visible wavelength for display applications to infrared wavelength for various sensing or pumping applications. For wavelengths that may be transmitted through a corresponding substrate of a VCSEL element, the requirements with respect to high output power have been met by so-called bottom emitting, flipchip-bonded devices having formed therein an oxide aperture. In this respect, it is to be noted that the terms "bottom" and "top" refer to positions or directions with respect to the substrate on which a VCSEL device is formed. Hence, a bottom emitting VCSEL describes a laser device emitting its output power through the substrate. By means of a heat sink, which is closely located to the laser active area, a very efficient heat removal is provided for the bottom emitting configuration so that relatively high output powers may be generated, wherein, however, this technology is limited to the emission of wavelengths for which the substrate is transparent.

In view of this serious drawback it has been proposed to remove the absorbing material in the substrate, wherein issues concerning the reliability and the requirement for additional fabrication steps may render these approaches less than desirable for mass production of VCSEL elements. For this reason, top emitting VCSEL devices represent an attractive possibility for devices emitting at wavelengths corresponding to the absorption range of the substrate. Generally, the output power of a top emitting VCSEL can be increased by enlarging the active area of the VCSEL. This is usually accomplished by correspondingly increasing an aperture that is formed closely to the active area, wherein the aperture typically provides a current confinement and a restriction of the optical field. Frequently, this aperture is formed by an electrically conductive and transparent material layer, the peripheral area of which is selectively oxidized so as to convert the periphery into a non-conductive oxide material. In other approaches, a conductive and transparent material layer may be modified at the periphery by ion implantation so as to reduce the conductivity and the transmittance of the periphery. Presently, top emitting VCSEL devices having an oxide-based aperture seem to be the most promising approach for demanding applications. For example, VCSEL devices having an output wavelength of 980 nm have been fabricated with an oxide aperture size greater than 90 µm, thereby achieving an output power of more than 100 milliwatts. The increase in the output power, however, is accompanied by a significant decrease of the wall-plug efficiency to about half the value of VCSEL devices having a small oxide aperture. Consequently, VCSEL devices having a large active area may not be considered promising for high power applications when a high efficiency is required.

In view of the problems identified above, there exists a need for a VCSEL device that enables high power output with moderately high efficiency without being restricted to transmittance wavelength range of a substrate.

SUMMARY OF THE INVENTION

Generally, the present invention addresses the above-specified object by providing a laser device and a method for fabricating the same, wherein a plurality of VCSEL elements are provided within a specified chip area and are operated in parallel to achieve a high output power. Moreover, the arrangement of the individual VCSEL elements within the specified chip area is based on the inventor's concept that the lateral size of the effective laser active area of each VCSEL element and the pitch of nearest neighbors of each VCSEL element is to be taken into consideration so as to simultaneously obtain a moderate power density, while nevertheless maintaining a high wall-plug efficiency. Since it is known that large active areas in a VCSEL element may drastically compromise the overall efficiency, whereas VCSEL elements having a relatively small aperture exhibit a high wall-plug efficiency, the output power of the laser device may be increased by using plural, smaller-sized, highly efficient VCSEL elements instead of an inefficient single high output power VCSEL element, wherein the effective size of the active area, for instance determined by an aperture, of the individual small-sized VCSEL elements is selected, in combination with the pitch of nearest neighbors, so as to not only maintain a high efficiency, but also provide a high power density. The high power density reduces production cost per Watt output power, whereas the high wall plug efficiency maintains cost for heat management low.

According to one aspect of the present invention, therefore, a laser device comprises a substrate and a plurality of vertical cavity surface emitting laser (VCSEL) elements formed thereon, wherein each of the VCSEL elements has an effective laser active region with a respective defined center point and a defined lateral size. The defined lateral size of each VCSEL element is equal to or less than 30 µm. Furthermore, a pitch between the center points of nearest neighbors of the VCSEL elements is equal to or less than 80 µm.

As will be described later on, the wall-plug efficiency of small sized VCSEL elements is only slightly affected by a variation of a pitch between adjacent VCSEL elements, whereas large sized VCSEL elements exhibit a significant drop in efficiency at a reduced pitch between adjacent elements owing to the mutual thermal heating effect of nearest neighbors. Hence, the lateral size of the effective laser active region in the above-specified range allows to maintain a relatively high efficiency while nevertheless selecting the pitch between nearest neighbors to 80 µm or even less so as to achieve a high power density.

According to a further embodiment, the laser device additionally comprises a first current terminal and a second current terminal, wherein each of the VCSEL elements is connected to the first and the second current terminals. The provision of a commonly used current terminal for the plurality of VCSEL elements allows a parallel operation without unduly occupying precious chip area.

In a further embodiment, each of the VCSEL elements comprises a radiation output window that is disposed opposite to the substrate. Thus, the laser device may advantageously be designed as a top-emitting device, thereby substantially avoiding the drawbacks of currently available high power bottom emitters. Hence, the laser device may be designed for a wide range of output wavelengths without being restricted to the transmittance range of the substrate.

In a further preferred embodiment, each of the VCSEL elements has a configuration that corresponds to the same design. Using the same design for the VCSEL elements facilitates the manufacturing, while still providing a high degree of flexibility in adapting power density and efficiency, since for the same basic laser design the geometry of the VCSEL array may correspondingly be adapted. That is, the same basic VCSEL design may be used and, by varying the number of VCSEL elements, the pitches thereof as well as the effective lateral size, the absolute power, the power density, and the efficiency may all be adjusted within a wide range so as to conform to the requirements of a specified application.

In this respect, it should be noted that the term "design" is to characterize "vertical" properties of the VCSEL element as well as "horizontal" or "lateral" properties of the element. The vertical properties may include the vertical configuration of the VCSEL element, such as the type of laser active region and the semiconductor materials used therein, the type of reflectors formed in the VCSEL element and the materials therefor as well as the manufacturing processes involved, and the like. The vertical properties substantially determine the output wavelength of the device, the output direction, partly the basic efficiency, and the like. On the other hand, the horizontal or lateral properties, such as the lateral dimension, the lateral shape, the effective size of the laser active region, which is typically determined by providing a corresponding aperture close to the active region, and the like, may also significantly influence the efficiency, as previously noted. Thus, considering the above definition, the present invention provides for the potential of adjusting power density and wall-plug efficiency of the laser device by merely modifying horizontal or lateral parameters for any given vertical configuration of the VCSEL elements, independent from any process technology used, which may, of course, be separately optimized to further enhance output power and/or efficiency.

In a further embodiment, the pitch between the nearest neighbors of each VCSEL element is substantially identical for each of the VCSEL elements. In this way, a simple pattern of VCSEL elements may be formed, thereby facilitating the manufacturing process while the total size of the pattern as well as the pitch in combination with the effective lateral size enable the adjustment of the device characteristics, such as total output power, power density, and efficiency.

In a further embodiment, the plurality of VCSEL elements are arranged in a hexagonal pattern, which enables the arrangement of a maximum number of individual VCSEL elements for a given pitch between nearest neighbors and a given available chip area. Hence, the power density may be optimized.

In a further preferred embodiment, each of the VCSEL elements is located on a site of a lattice defined by the VCSEL elements and at least one lattice site is occupied by a bond pad. In this way, a very compact configuration may be achieved that includes a bond pad at the expense of one lattice site, thereby still providing a high power density.

In a further embodiment, the pitch to nearest neighbors of a first VCSEL element differs from the pitch to nearest neighbors of a second VCSEL element. Hence the laser device may comprise an array of VCSEL elements, wherein the pitch may vary at least for two VCSEL elements, thereby providing an increased design flexibility for configuring the laser array. For instance, the laser device may include one or more areas having a reduced heat dissipation capability compared to other device regions. In this case, the power density may be locally adapted to the heat removal capabilities by correspondingly selecting the corresponding pitch of VCSEL elements formed within these areas. Thus, at an area with reduced heat dissipation capabilities, the pitch between nearest neighbors may be increased compared to a region of the laser device that allows improved cooling.

In a further variant, the effective lateral size of at least two VCSEL elements may differ from each other, thereby providing an increased degree of flexibility in adapting the laser device to application requirements. As in the case described above, the effective lateral size may be selected in conformity with the heat removal capabilities of the various device areas so as to avoid an undue heating of specific VCSEL elements. In other embodiments, both the pitch to nearest neighbors and the effective lateral size of at least two VCSEL elements may be varied so as to correspond to specific application requirements.

In a further embodiment, the laser device comprises an aperture layer having formed therein an aperture that substantially determines the defined lateral size of the effective laser active region. The provision of an aperture layer is a well-established technique and therefore allows a high degree of manufacturing compatibility with well-known manufacturing processes.

In a further embodiment, the aperture layer comprises an oxidized periphery to define the aperture within said periphery. As previously noted, the provision of an oxide aperture is presently considered a promising approach for achieving a high efficiency in VCSEL elements. Thus, this technology may advantageously be combined with the lateral configuration of a VCSEL array in accordance with the principles of the present invention so as to accomplish high power density at a high efficiency.

In a further embodiment, a layer stack forming at least a first reflector of each of the VCSEL elements comprises a periphery that is modified by ion implantation so as to define the aperture within the periphery. Thus, the present invention may advantageously be combined with standard fabrication methods for laterally patterning the current distribution and/or the optical confinement of a VCSEL element.

According to a further preferred embodiment, the defined lateral size of the effective laser active region of each VCSEL element is equal to or greater than 10 μm. Based on investigations by the inventors, the above-specified range for the lateral size may provide for high efficiency at a moderate output power, wherein a decrease in efficiency is substantially negligible for the above-specified range of pitches to the nearest neighbors when the VCSEL elements are arranged in an array.

In a further preferred embodiment, the pitch between nearest neighbors of each of the VCSEL elements is equal to or greater than 40 μm. With a minimum pitch of 40 μm, the mutual thermal heating effect of adjacent VCSEL elements may still remain substantially negligible. Moreover, a minimum distance of approximately 40 μm is compatible with presently available process technologies so that the manufacturing of high power density VCSEL devices having a high efficiency is possible by using well-established process techniques.

In one preferred embodiment, the pitch between nearest neighbors of each of the VCSEL elements is in the range of 55 μm-65 μm. A pitch within this range may provide an optimum trade-off between power density and efficiency for a broad class of applications and for a wide variety of VCSEL designs.

In a further embodiment, the effective laser active region has a substantially circular shape. The circular shape of the laser active region, i.e., of the electrically and optically effective laser region, may provide advantages in terms of efficiency and resulting beam profile compared to other geometric configurations.

In a further preferred embodiment, the laser device further comprises a contiguous metal layer for electrically connecting the plurality of VCSEL elements. The contiguous metal layer provides an increased current carrying area, thereby minimizing any voltage drops so that substantially identical currents are supplied to each of the VCSEL elements. Moreover, the contiguous metal layer may provide for an improved heat conductivity so as to establish essentially identical thermal conditions for at least the some of the VCSEL elements.

In a further embodiment, the contiguous metal layer covers all of the array except for the VCSEL elements. By using the total available surface area of the laser device, the advantages with respect to current and heat transportation are even more enhanced.

In accordance with a further aspect of the present invention, a method of adjusting a power density of a VCSEL array comprises establishing a relationship for a specified test array of VCSEL elements between an effective lateral size of a laser active region of the VCSEL elements, which are formed according to a defined design, a pitch of nearest neighbors of the VCSEL elements when arranged in the specified test array, and a power output by the test array. Then, positions of the VCSEL elements having the defined design within the VCSEL array are determined on the basis of the established relationship, and finally the VCSEL array is manufactured by forming the VCSEL elements of the defined design at the determined positions.

As previously pointed out, the present invention provides a technique that allows the adjustment of the power density and the efficiency of a laser device including a plurality of VCSEL elements of an arbitrary design by relating lateral design parameters, such as the pitch of nearest neighbors and the effective lateral size of the VCSEL elements to the output power of a correspondingly formed test array. Although in single VCSEL elements merely the output power or the efficiency may be optimized, the present invention provides for a possibility of increasing both the power density and the efficiency by establishing a corresponding relationship for any given VCSEL design. Thus, application-specific high power laser devices including a VCSEL array may be fabricated, wherein the wavelength and/or the design and/or the corresponding process technology may be selected according to the circumstances dictated by the application and/or by the manufacturer's capabilities.

In a further embodiment, the method comprises determining a desired range for the power density on the basis of a desired operating current range and a minimal pitch of nearest neighbors determined by a selected manufacturing technology, wherein the desired power density range includes a maximum of the power density for a specified operating current from the desired operating current range. As will be shown, different effective lateral sizes will result in different power densities for a minimal pitch of nearest neighbors. Thus, corresponding design parameters may readily be determined for the maximum power density or for an extremely high power density. Thus, in one embodiment a desired effective lateral size of the laser active region for the VCSEL elements is determined so as to obtain a power density that is within the desired range.

Advantageously, the manufacturing of the VCSEL array includes forming a current aperture having the desired lateral size by selectively oxidizing a material layer so as to obtain a conductive non-oxidized layer portion as the current aperture.

As previously discussed, the selective oxidization is considered a promising manufacturing technique for improving efficiency of an individual device so that correspondingly well-established process techniques are available.

In other embodiments, a current aperture is formed by modifying a material layer by ion implantation, which also represents a well-established process technique.

In another preferred embodiment, the method further comprises determining data corresponding to a wall-plug efficiency of the specified test array for a plurality of different pitches and effective lateral sizes. Additionally, the array positions are then determined on the basis of the data. These data, which may preferably be obtained on the basis of measurements, which may, however also be obtained by calculation or a combination of measurements and calculations, may allow to effectively estimate the efficiency and thus the heat dissipation of a VCSEL array under consideration, thereby allowing more flexibility in determining appropriate design parameters with respect to a specific application.

In a further embodiment, the method further comprises estimating a heat distribution of the VCSEL array for predefined operating conditions and selecting the pitches and/or the effective lateral sizes on the bias of the estimated heat distribution. The operating conditions for a specified application may lead to a non-uniform heat distribution across the VCSEL array. For instance, a specified application may require operating conditions in which only the periphery of the VCSEL array is effectively cooled, while the center portion has to rely on an effective heat transport to the periphery. Based on the estimated heat distribution, the lateral design parameters may then accordingly be selected so as to compensate or at least reduce the effect of a non-uniform heat dissipation.

In one embodiment, the pitch for VCSEL elements to be positioned on an area of increased heat production or reduced heat removal is selected greater than for the remaining VCSEL elements. In this way, the reduced heat dissipation capability of a specific area of the VCSEL array may at least be partially be compensated for without duly compromising the power density of the entire VCSEL array. In other embodiments, the lateral size of the VCSEL elements may be adjusted in conformity with the heat removal capabilities of a given application, wherein the lateral size is reduced in an area having a reduced heat removal capability.

Generally, the present invention provides a fabrication process for two-dimensional high power arrays that is completely compatible with the manufacturing processes of single VCSEL devices, especially top emitting devices, wherein no additional process steps are required. Furthermore, the solution of the present invention is highly cost-effective since it does not necessarily require a special mounting of the laser chips. In addition, the technique provided by the present invention is independent of the emission wavelength of the laser device and is also independent of the specifics of the individual VCSEL elements, i.e., of the vertical characteristics thereof, except for the lateral characteristic of the effective size of the laser active region. Furthermore, the present invention allows to scale the array size so as to meet the requirements with respect to total output power by simply increasing the array size, i.e., the number of individual VCSEL elements while still maintaining the power density across the array high.

Further objects, advantages, and features of the present invention will become apparent upon studying the following detailed description as well as the claims, wherein an understanding of the present invention may be enhanced by referring to the accompanying drawings, in which:

DETAILED DESCRIPTION OF THE PREFERRED EMBODIMENTS

In the following detailed description, further illustrative embodiments of the present invention will be described with reference to the drawings, wherein it should be emphasized that the devices shown therein, the manufacturing process for forming the devices, and the measurement data shown in the graphs are of illustrative nature only and should not be considered as limiting the present invention. On the contrary, the present invention provides a laser device and a technique for manufacturing the same, wherein a high degree of flexibility is provided with respect to the selection of a specified technology, the (vertical) design as well as the operating conditions including any peripheral means for influencing the thermal conditions at which the laser device is operated. This is accomplished in that lateral design parameters such as the pitch and the effective lateral size of the individual laser devices are correspondingly estimated and controlled in the manufacturing process. Hence, any data referring to power density, output power, wavelength, wall-plug efficiency, and the like may vary depending on the process technology, the vertical design and the application.

Figure 1A:
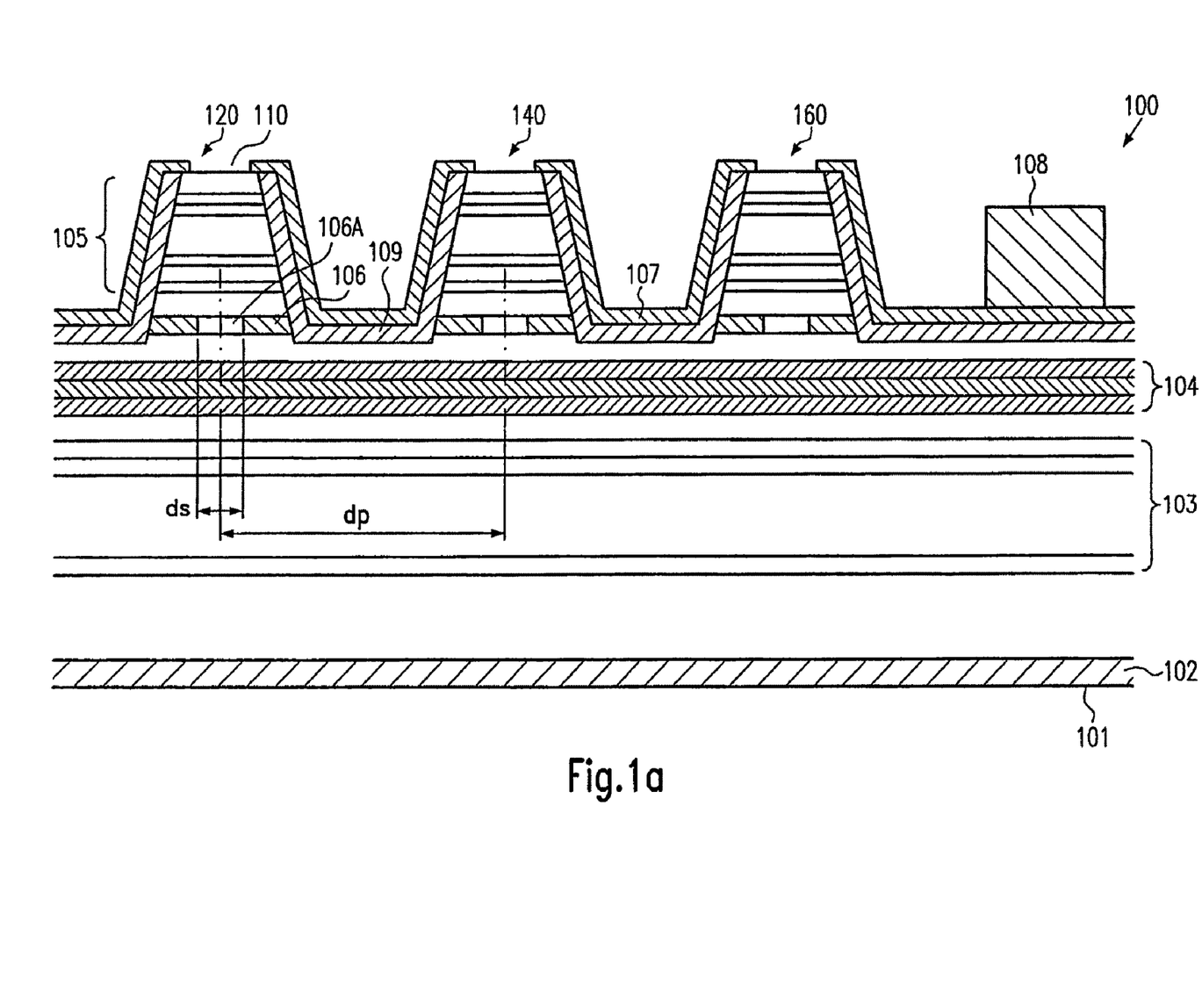
FIG. 1a schematically shows a cross-sectional view of a laser device including a plurality of VCSEL elements with oxidized aperture layers according to the present invention.

FIG. 1a schematically shows a cross-sectional view of a laser device 100 according to the present invention. The laser device 100 comprises a plurality of individual VCSEL elements 120, 140, 160 formed on a substrate 101 that is appropriate for forming the VCSEL element thereon. Corresponding substrates are well known in the art and will thus not be described in more detail herein. The substrate 101 may have formed on its back side a metal layer 102 that serves as a common current terminal for the plurality of VCSEL elements 120, 140, 160. Each of the VCSEL elements 120, 140, 160 comprises a first reflector 103, for instance comprised of a plurality of layers having alternately a high refractive index and a low refractive index with an appropriate optical thickness so as to provide for the desired reflectivity. The VCSEL elements 120, 140, 160 further comprise a second reflector 105 that may have a substantially similar configuration as the first reflector 103, wherein a laser active region 104, comprised of one or more semiconductive layers, is disposed between the first and second reflectors 103, 105. The effective lateral size of the laser active region 104 may be determined by an aperture layer 106 having an aperture 106a that is electrically conductive and is transparent for the wavelength generated in the laser active region 104. The lateral size of the aperture 106a that also substantially determines the effective lateral size of the laser active region 104 is denoted as $D_s$. The aperture layer 106 may be formed of an oxide of the material defining the aperture 106a.

Furthermore, the device 100 may comprise metal lines 107 formed on a dielectric layer 109 and connected to a common bond pad 108 that serves as a second current terminal for the device 100. The bond pad 108 may be provided by a portion of the metal line 107 and does not need to form a protrusion as shown. The metal lines 107 define respective radiation output windows 110. The metal lines 107 may be formed by any appropriate metal with a sufficient thickness so as to provide the required operating current to the individual VCSEL elements 120, 140, 160 without a substantial voltage drop. For instance, the metal lines 107 may be provided in the form of a contiguous metal layer so as to reduce the resistance. Advantageously, the contiguous layer 107 may cover substantially all of the exposed surface of the device 100 except for the area occupied by the VCSEL elements 120, 140, 160. Providing the metal lines 107 in the form of a contiguous metal layer may also enhance the heat conductivity to enhance the uniformity of the temperature distribution across the substrate 100 during the operation. As previously discussed, the finally achieved temperature distribution significantly depends on the periphery of the laser device 100, such as the package, external heat sinks applied to the device 100, and the like. A distance, i.e., a pitch of the adjacent VCSEL elements 120, 140 measured between the corresponding center points of the apertures 106a is denoted as $D_p$ and represents in combination with the lateral size $D_s$ the horizontal or lateral design parameters of the device 100 for adjusting power density and efficiency of the device 100 for a given basic (vertical) design of the VCSEL elements 120, 140, 160, and a corresponding manufacturing technology.

As previously explained, the device 100 may be fabricated in accordance with well-established process techniques once the lateral design parameters $D_s$ and $D_p$ have been established. Since corresponding manufacturing processes are well known in the art, a detailed description thereof is omitted herein.

Figure 1B:
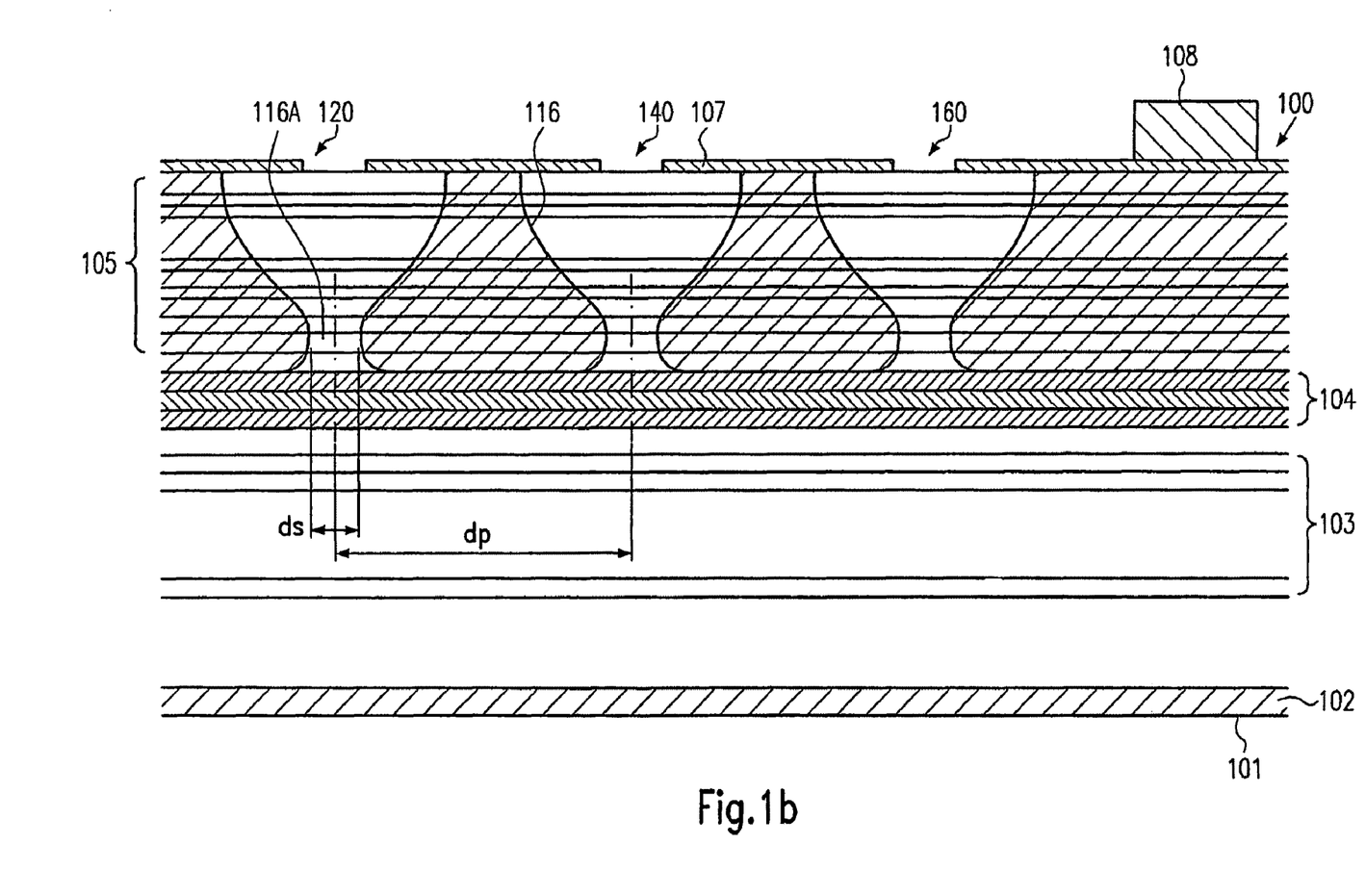
FIG. 1b schematically shows a cross-sectional view of a laser device including a plurality of VCSEL elements with a layer stack including implanted portions to define the lateral dimensions according to the present invention FIGS. 1c-1f schematically show top views of a VCSEL array having an appropriate pitch and lateral size for achieving high power density and high efficiency according to further illustrative embodiments.

FIG. 1b schematically depicts a device, in which the lateral sizes of the individual VCSEL elements are defined by a portion of the layer stack that is modified by ion implantation. For convenience, the same reference numerals are used for components identical or similar to those that are described with reference to FIG. 1a. A description of these identical or similar components is omitted.

As is illustrated in FIG. 1b, the device 100 has a planar configuration, wherein implanted portions 116 define respective effective current apertures 116A, which, in turn, substantially determine the effective lateral size of the individual VCSEL elements 120, 140, 160.

Corresponding manufacturing processes are well known in the art and therefore a detailed description thereof is omitted here.

Prior to discussing the operation of the laser device 100, the characteristics of a single isolation VCSEL element will be explained in more detail with reference to FIGS. 2 to 4, wherein, for convenience, reference is also made to the VCSEL element 120 of FIG. 1a including the oxidized aperture layer 106, since the approach of an oxidized aperture layer is presently considered superior compared to the implanted device shown in FIG. 1b. The following consideration may, however, readily be applied to implanted devices. For the following discussion, the VCSEL element may thus be considered as a single isolated VCSEL device. It should be noted that the measurements were performed on isolated VCSEL devices formed on chips on a corresponding wafer at room temperature, wherein a standard VCSEL design for an 850 nm device for optical data communication was used.

As previously noted, the lateral size 106a, i.e., the aperture size $D_s$, is an important design parameters for an isolated VCSEL element, influencing fundamental laser characteristics such as threshold current, maximum output power, efficiency, or resistance.

Figure 2:
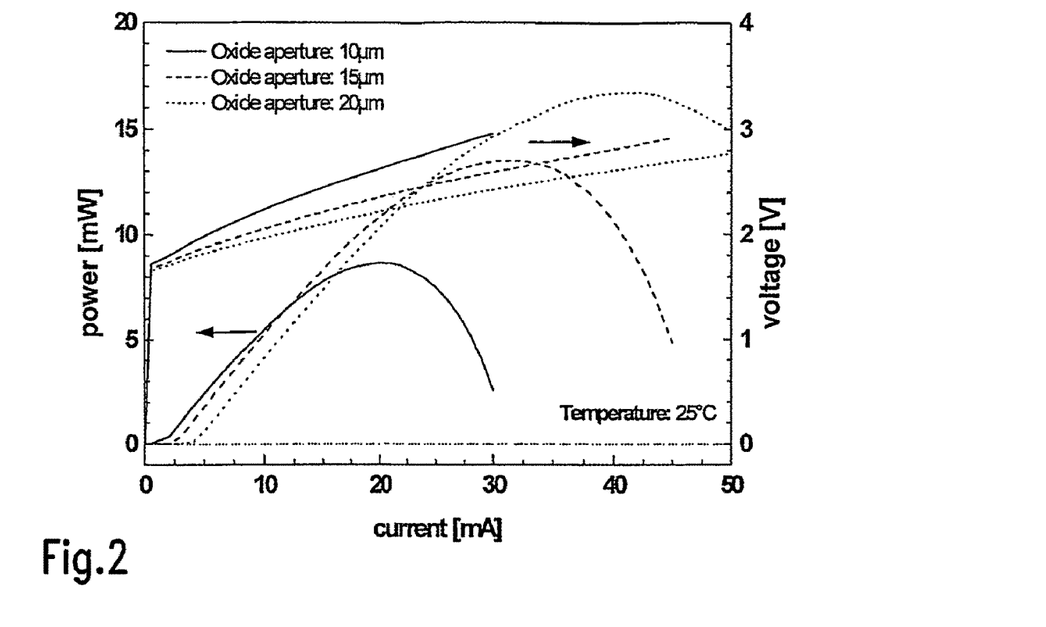
FIGS. 2, 3, 4a and 4b show graphs for explaining various operating parameters of a single VCSEL element.

FIG. 2 schematically shows a graph illustrating output power and voltage for varying operating currents for the device 120 (when considered as a single device) for three different lateral sizes $D_s$ of 10 µm, 15 µm and 20 µm. As is evident from the measurement data shown in FIG. 2, the threshold current and the maximum output power increase, whereas the device resistance decreases as the lateral size $D_s$ increases. The limitation of the output power is determined by the so-called "thermal roll-over" that may be considered as an internal heating effect of the device 120 at increased operating currents so that the efficiency of the device 120 is reduced.

Figure 3:
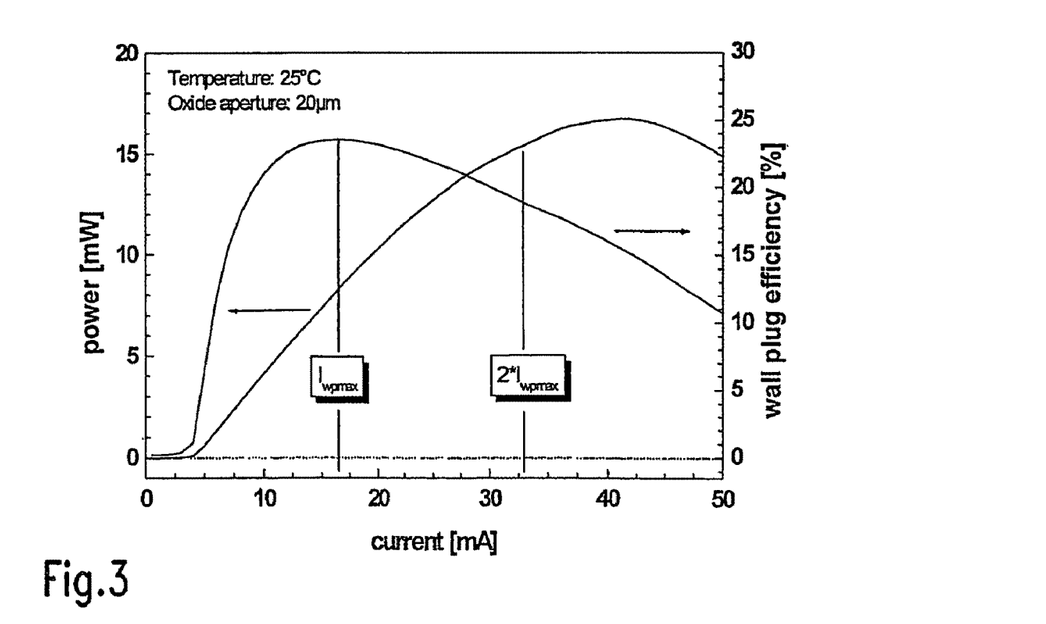

FIG. 3 represents the measurement results for the device 120 for a lateral size $D_s$ of 20 µm, wherein additionally to the output power the wall-plug efficiency is shown versa the operating current. As is evident from FIG. 3, the wall-plug efficiency rapidly increases after the operating current exceeds the laser threshold and reaches its maximum (denoted as $WP_{max}$) at a fairly low current $I_{WPmax}$. With a further increase of the current, the wall-plug efficiency continuously decreases owing to the internal heating as explained above. Since the output power at the current $I_{WPmax}$ is typically less than half of the maximum output power of the device, $I_{WPmax}$ may be considered as not being suitable for actual operating conditions. A typical operating current may be selected somewhere around the doubled value of $I_{WPmax}$ with a significantly increased output power, wherein the status of the thermal roll-over is, however, still reliably avoided. As is seen, a certain reduction of the wall-plug efficiency is associated with an operating current of $I=2\times I_{WPmax}$.

Figure 4A:
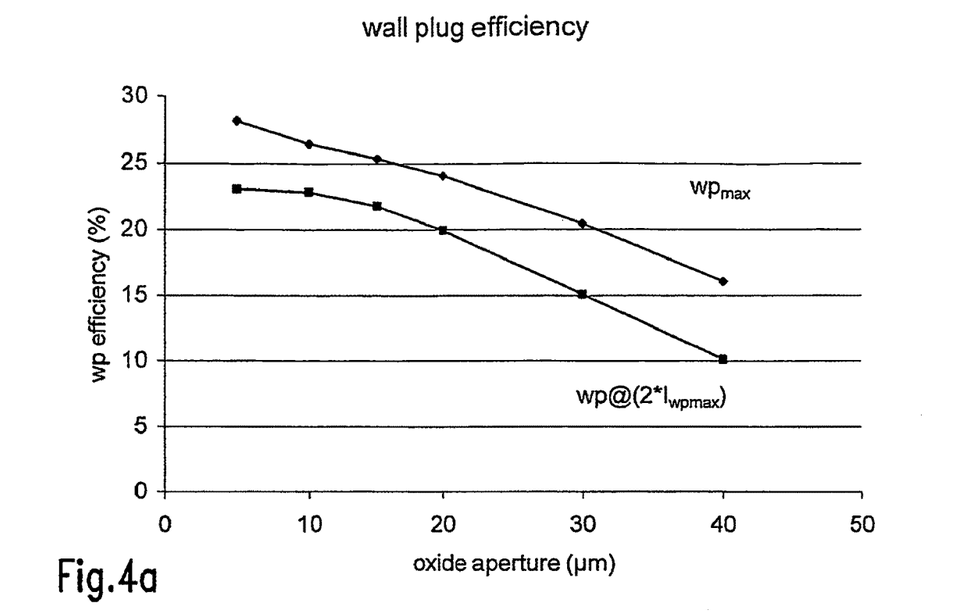
Figure 4B:
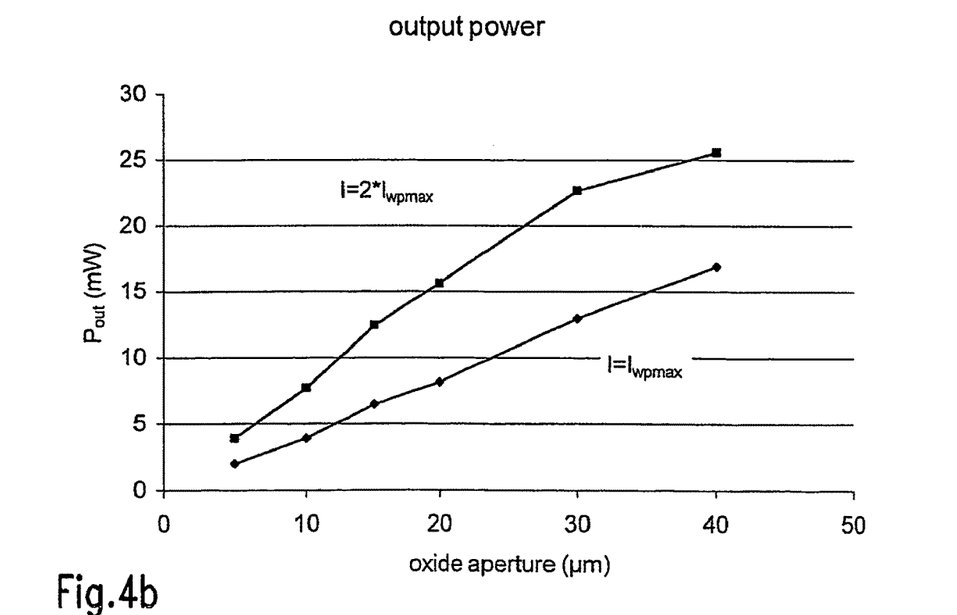

FIGS. 4a and 4b show the dependence of the wall-plug efficiency and the output power, respectively, from the lateral size $D_s$ for the two different operating currents specified above. FIG. 4a illustrates that the maximum wall-plug efficiency decreases from approximately 27%, for a lateral size $D_s$ of 5 µm, to about 16% for a $D_s$ of 40 µm. At the same time, the output power increases from about 3 milliwatts to 17 milliwatts (see FIG. 4b, lower curve), whereas an output power range from about 3 milliwatts to more than 25 milliwatts is obtained for the operating current of $2\times I_{WPmax}$. For this operating current, a reduction of the wall-plug efficiency may be seen (FIG. 4a, lower curve) that is in the order of 3-6% with respect to the current at the maximum wall-plug efficiency.

Consequently, for the single VCSEL element 120 a trade-off has to be made between the wall-plug efficiency and the output power, thereby allowing only to maximize one of these two important parameters.

For high power applications, it may not be necessary to extract the required amount of output power from a single device. A parallel operation of several devices may be used to achieve the required output power. According to the present invention, a high value for the wall-plug efficiency and the output power is obtained by taking advantage of the fact of a high efficiency of devices having a relatively small lateral size $D_s$ and by increasing the output power in that the number of VCSEL elements on a given chip area is increased, wherein a relation is established between output power and/or wall-plug efficiency and the lateral parameters $D_s$ and $D_p$. To this end, the progression of the maximum wall-plug efficiency may be investigated for a different number of VCSEL elements for different lateral sizes $D_s$, wherein the pitch $D_p$ may be kept constant, for instance at 130 µm.

Figure 5:
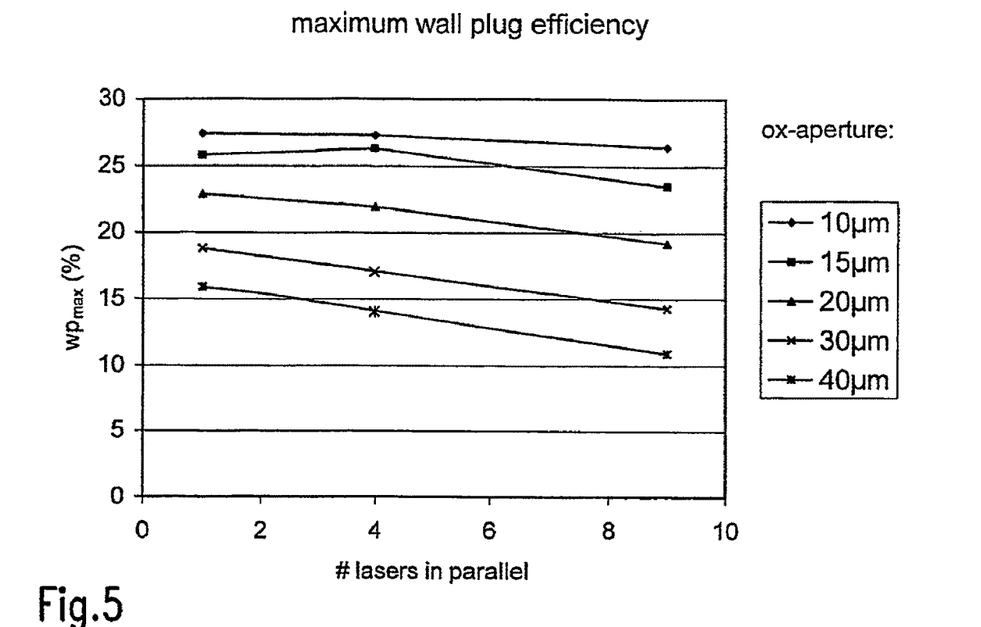
FIG. 5 depicts a dependency of the maximum wall-plug efficiency on the number of VCSEL elements operated in parallel for different aperture sizes.

FIG. 5 shows the corresponding measurement results for 1, 2×2, and 3×3 VCSEL elements at a pitch $D_p$ of 130 µm operated in parallel for lateral sizes $D_s$ between 10 µm and 40 µm. As is evident from FIG. 5, for devices having a lateral size $D_s$ of 10 µm and 15 µm only a slight decrease in the wall-plug efficiency of less than 2-3% compared to a single device may be observed (cf. FIG. 3). For the large lateral size $D_s$, a decrease of about 5%, i.e., more than 25% of the total value, is obtained. Thus, the drop of the efficiency for a laser array (in the present case a 3×3 array) may be negligible at a pitch $D_p$ of 130 µm for a lateral size $D_s$ up to approximately 15 µm, whereas a significant drop in the efficiency takes place for the lateral size $D_s$ of greater than 30 µm.

For establishing a relation among output power, wall-plug efficiency, and packing densities, i.e., the pitch $D_p$, of the arrays corresponding measurements have been performed for an array of 3×3 VCSEL elements beginning with the smallest pitch compatible with the technology used. Moreover, different apertures 106a, i.e., different lateral sizes $D_s$, have been fabricated and have been studied.

Figure 6:
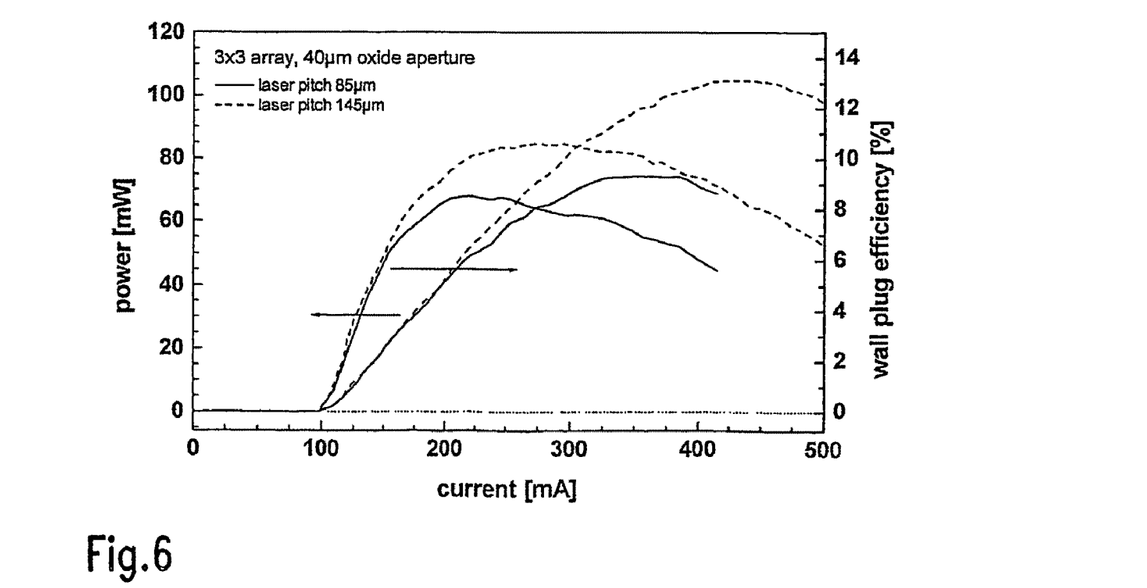
FIG. 6 is a graph representing output power and wall-plug efficiency, respectively, for a 3×3 array of large sized VCSEL elements at two different pitches.

FIG. 6 shows a graph representing the dependence of output power and wall-plug efficiency on the operating current for a 3×3 array with a lateral size $D_s$ of 40 µm at two different pitches $D_p$ of 85 μm and 145 μm. As is evident from FIG. 6, for moderately low operating currents of less than 200 milliamps, the influence of the pitch $D_p$ is insignificant. For currents at the vicinity of the thermal roll-over, the thermal coupling of adjacent VCSEL elements, also referred to as thermal cross talk, reduces the maximum output power of the densely packed array, thereby also reducing the maximum wall-plug efficiency, which is thus obtained for the densely packed array at lower currents.

Figure 7A:
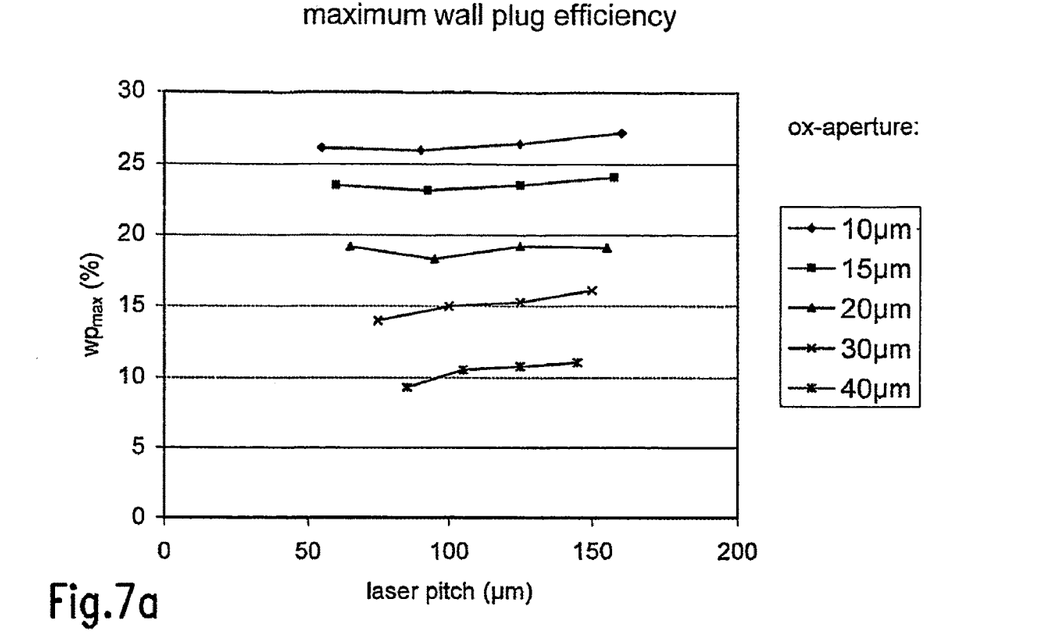
FIGS. 7a and 7b are graphs for demonstrating the dependency of the laser pitch on the wall-plug efficiency for different aperture sizes at two different operating currents.
Figure 7B:
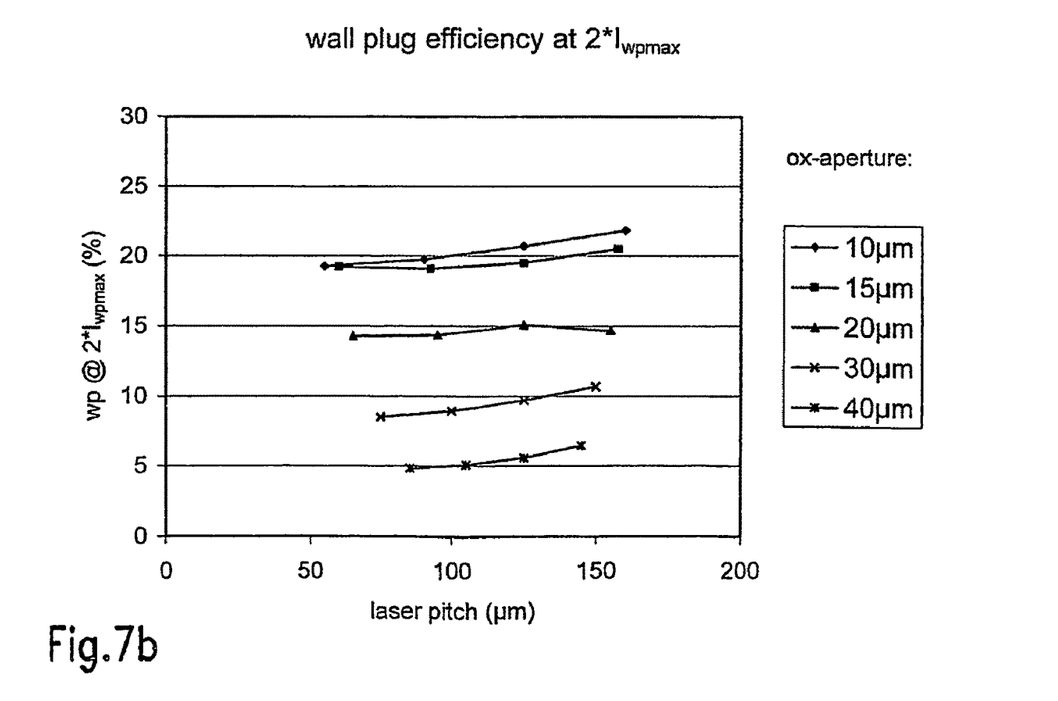

FIG. 7a shows measurement results for the maximum wall-plug efficiency, i.e., for the operating current $I_{WPmax}$, for different pitches $D_p$ for 3×3 arrays having lateral sizes $D_s$ ranging from 10 μm to 40 μm. FIG. 7b shows the corresponding measurement results for the wall-plug efficiency at an operating current of $2\times I_{WPmax}$. As is evident from FIGS. 7a and 7b, neither the maximum wall-plug efficiency nor the efficiency at the higher operating current significantly varies with the pitch $D_p$ for a small lateral size $D_s$ between 10 μm and 20 μm. A tendency for a reduced efficiency for smaller pitches $D_p$, however, can clearly be observed for a lateral size $D_s$ of 30 μm and 40 μm. The relatively strong variation of the efficiency with the pitch is, however, substantially negligible compared to the variation that is caused by the different lateral sizes $D_s$.

Figure 8A:
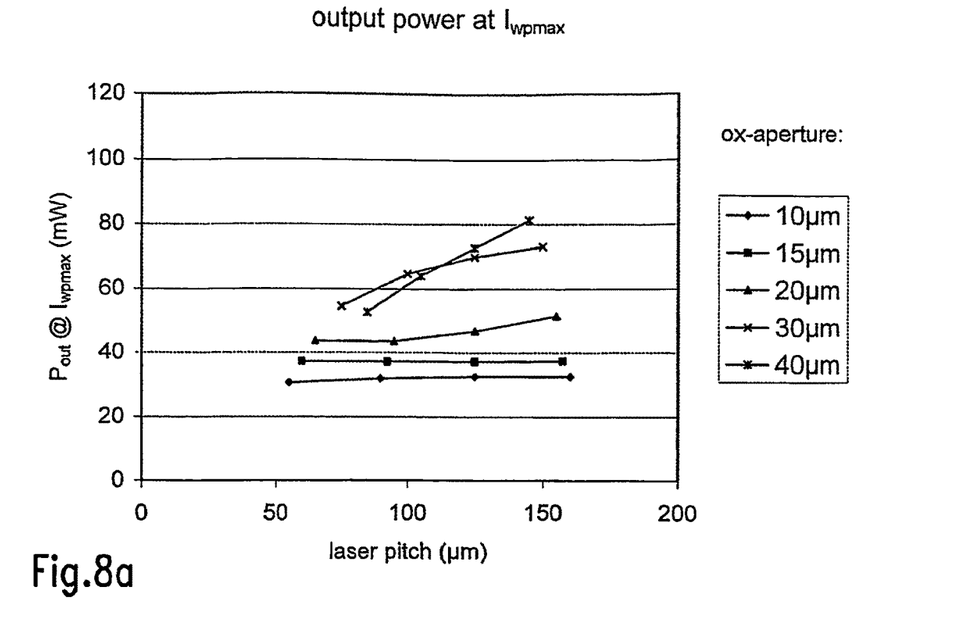
FIGS. 8a and 8b are graphs representing the dependence of the output power from the laser pitch for different aperture sizes at two different operating currents.
Figure 8B:
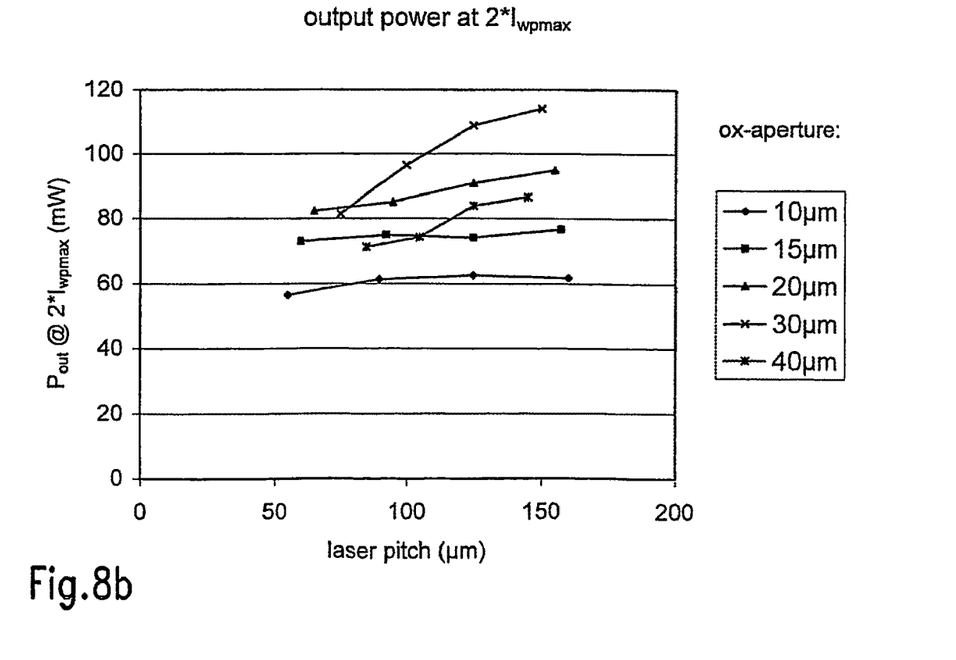

FIGS. 8a and 8b show the corresponding measurement results for the same arrays as in FIGS. 7a and 7b, wherein the output power is plotted against the pitch $D_p$ for the operating current at the maximum wall-plug efficiency (FIG. 8a) and for an operating current of 2× the current at the maximum wall-plug efficiency (FIG. 8b). As is indicated by FIGS. 8a and 8b, the output power at each of the two operating currents significantly drops with a decreasing pitch $D_p$ for the arrays having a lateral size $D_s$ of 30 μm and 40 μm. On the other hand, the arrays having the small lateral size $D_s$ of 10 and 15 μm exhibit only a minor variation. The reason for the strong variation of the larger-sized VCSEL elements is the shift of the maximum wall-plug efficiency to lower current values, as has been previously explained. For the same reason, the output power for the array having the lateral size $D_s$ of 20 μm shows a certain dependence on the pitch $D_p$, whereas the efficiency remains substantially constant.

As a consequence, a strong dependence of the output power at the two different operating currents with respect to the pitch $D_p$ for the arrays having the larger lateral size $D_s$ of 30 μm and 40 μm is observable, whereas these parameters are substantially independent from the pitch $D_p$ for the small lateral sizes $D_s$ of 10 μm and 15 μm. Additionally, the wall-plug efficiency is more stable for the devices having the small lateral size $D_s$.

As previously discussed, the output power may not necessarily be considered as the dominant design criterion since high output power may be associated with a low efficiency, thereby possible requiring considerable effort in terms of packaging and heat sink capabilities. For a plurality of high power applications the power density, i.e., the output power per chip area, may therefore be an important parameter.

Figure 9:
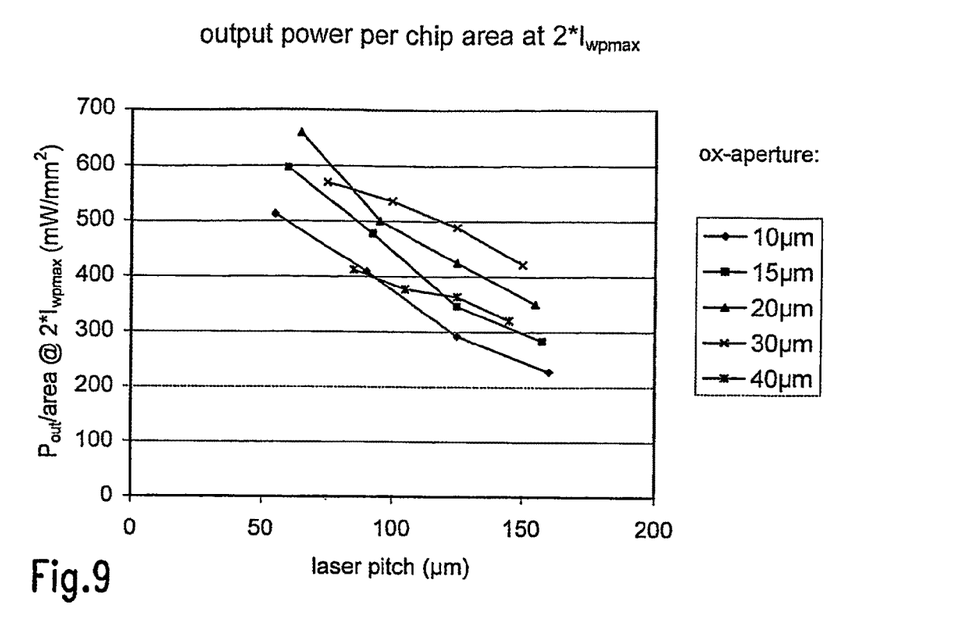
FIG. 9 is a graph illustrating the dependence of the power density on the VCSEL pitch for different aperture sizes.

FIG. 9 illustrates corresponding graphs for 3×3 arrays with an operating current of $2\times I_{WPmax}$ divided by the chip area of the individual arrays, wherein the chip area includes a 50 μm non-usable border area and 0.02 mm² for a bond area. As is indicated by FIG. 9, irrespective of the lateral size $D_s$ of the arrays, the power density is maximized for the densest device packing configuration. Even for the devices having the lateral size $D_s$ of 30 μm or 40 μm, the reduction in size of the chip area at the smaller pitches $D_p$ completely compensates the decrease in the output power (cf. FIG. 8b). For instance, a total maximum value of 0.65 watts/mm² has been obtained for the array having the lateral size $D_s$ of 20 μm with a pitch $D_p$ of 65 μm. Although the wall-plug efficiency (cf. FIG. 7b) and the output power (FIG. 8b) are almost independent of the pitch $D_p$ for the lateral sizes $D_s$ of 10 μm or 15 μm, the power density shows a variation of approximately a factor of 2 between the smallest and the biggest pitch $D_p$. The reason for this is the different chip area.

Figure 10:
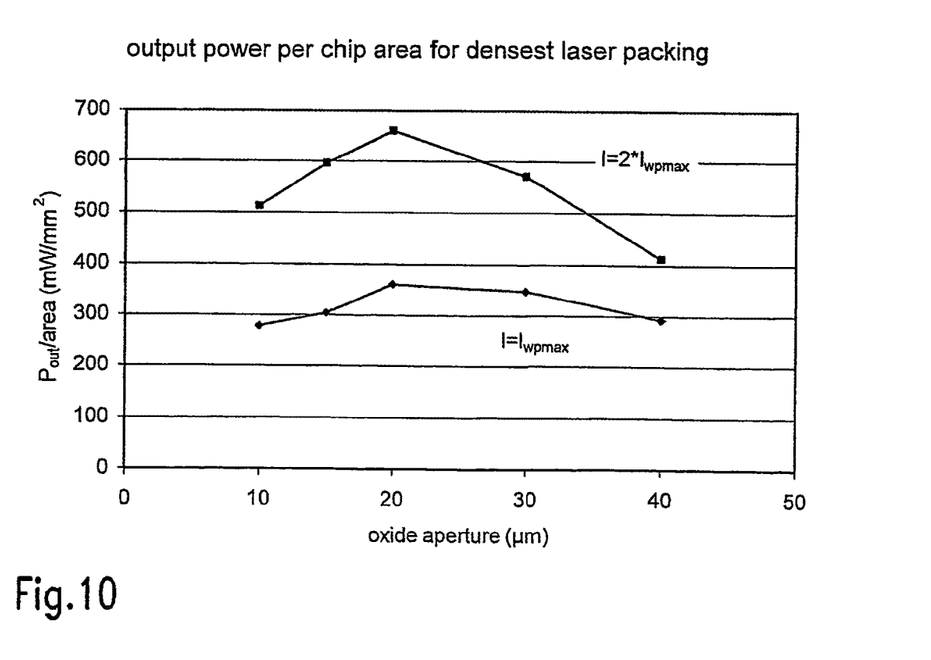
FIG. 10 is a graph representing the dependence of the power density on the aperture size for different operating conditions.

FIG. 10 shows a graph to more clearly demonstrate the influence of the lateral size $D_s$ on the power density. To this end, the maximum power density, achieved with the densest packing configuration, is plotted as a function of the different lateral sizes $D_s$ for two different operating currents. The graph of FIG. 10 indicates that for an operating current between $I=I_{WPmax}$ and $I=2\times I_{WPmax}$, the densest packing of devices with a lateral size $D_s$ of approximately 20 μm provides the maximum output power density. As a result, the normalization of the output power with respect to the chip area clearly demonstrates that the densest packing configuration offers the highest output power density, irrespective of the lateral size $D_s$. For the test arrays used for establishing a relationship between power density and/or wall-plug efficiency with respect to the lateral size $D_s$ and the pitch $D_p$, a value of approximately 20 μm for the lateral size $D_s$ results in the maximum output power density of approximately 0.65 watts/mm². It should be appreciated that these values may change according to the actual operating conditions, the vertical laser design, the heat management periphery, and the like. It is, however, important to note that an appropriate selection of the lateral size $D_s$ can be carried out for any type of VCSEL design and any application once a corresponding relationship, as for instance represented by FIG. 10, is established.

Moreover, the efficiency of the laser array may be considered in that the output power per chip area, i.e., the power density, and the wall-plug efficiency are combined so as to estimate the power dissipation per chip area, that is, the power per chip area that has to be removed from the chip.

Figure 11:
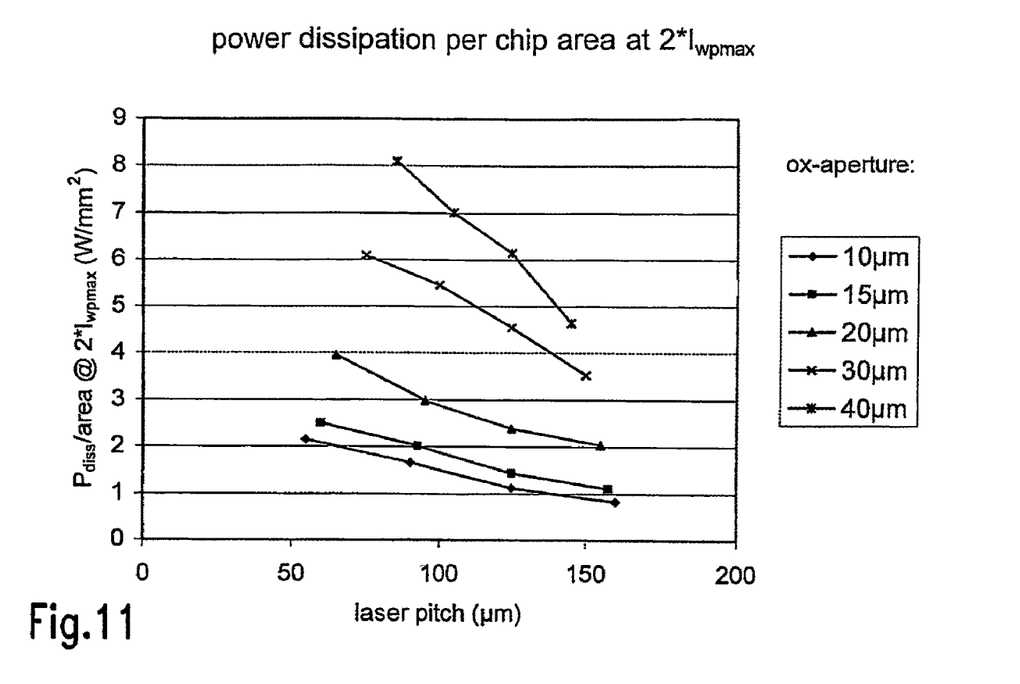
FIG. 11 is a graph illustrating the dependence of the dissipated power per area on the laser pitch for different aperture sizes.

FIG. 11 shows a corresponding graph for the power dissipation per chip area at an operating current of $2\times I_{WPmax}$ with respect to the pitch $D_p$ for a plurality of lateral sizes $D_s$. As is evident, the power dissipation ranges from approximately 1 watt/mm²-2 watts/mm² for the 10 μm devices and from 4.7 watts/mm² to approximately 8.1 watts/mm² for the 40 μm devices. Owing to the large differences in the wall-plug efficiency for the different lateral sizes $D_s$(cf. FIG. 7b), the power dissipation per chip area of the 40 μm devices is higher by more than a factor of 4 compared to the power dissipation of the 10 μm devices. Thus, the power dissipation per chip area clearly favors the devices having a smaller lateral size $D_s$ due to the significantly higher wall-plug efficiency of these devices.

As a result, the operation of a test array including nine VCSEL elements, such as the elements 120, 140, 160, in a 3×3 array with a pitch $D_p$ of approximately 130 μm indicates that the drop in efficiency due to a thermal cross-talk is negligible for a lateral size up to 15 μm, but is, however, significant for lateral sizes $D_s$ exceeding 30 μm. Upon varying the packing density, i.e., the pitch $D_p$, a strong decrease in the output power over a wide range of operating currents may be observed with a decreasing pitch $D_p$ for arrays having a large lateral size $D_s$, for instance of 30 μm and 40 μm. The output power is, however, only slightly dependent on the laser pitch $D_p$ for the small lateral sizes $D_s$ of, for example, 10 μm and 15 μm. The same holds true for the wall plug efficiency. The relationships established above also indicate that the highest power density is offered by the densest packing mode, irrespective of the lateral size $D_s$. From a comparison of the maximum power density for the various lateral sizes $D_s$, for the given technology and measurement conditions a size of approximately 20 μm results in the maximum power density of approximately 0.65 watts/mm². Moreover, in view of the power dissipation per chip area, the devices having the smaller lateral size $D_s$ are preferable due to the higher wall-plug efficiency.

Based on these relationships, which may be established for any vertical design of the VCSEL elements and any process technology, such as the measurement results shown in the previous discussion, the lateral size $D_s$ may be selected to 30 μm and less, and preferably between 15-20 μm for a densely packed array, i.e., for a pitch $D_p$ less than approximately 80 μm, and preferably in a range between 40-70 μm, and more preferably between 55-65 μm. Since the relationship indicates that the thermal cross-talk effect merely slightly affects the wall-plug efficiency and the output power of devices having a lateral size $D_s$ in the above-specified range, the total output power may be adjusted by correspondingly increasing the array size, i.e., the number of VCSEL elements.

It should be noted that other relevant design and operation criteria, such as the vertical laser structure and an efficient heat removal may be additionally adjusted or optimized so as to further increase the power density and efficiency. In some cases, it may be advantageous to determine the heat distribution within a specified VCSEL array when the heat removal capabilities of a certain application are known in advance. Based on these results, the lateral size $D_s$ and/or the pitch $D_p$ may additionally be adapted so as to at least partially compensate for any heat removal non-uniformities.

Figure 1C:
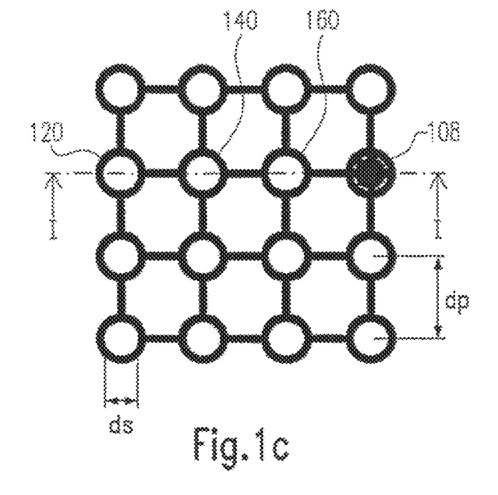

FIG. 1c schematically shows a top view of the laser device 100, wherein the individual VCSEL elements 120, 140, 160, etc., are arranged according to a lattice that has an identical pitch for each nearest neighbor of each of the individual VCSEL elements, wherein 4 nearest neighbors are provided for non-edge VCSEL elements. The metal lines 107 may connect the individual VCSEL elements in a grid-like manner, as shown in FIG. 1c, or may be provided in the form of a contiguous metal layer, wherein preferably the total exposed surface of the device 100 is covered by the metal layer, thereby improving heat conductivity and current drive capability, wherein a thickness of the metal layer may be selected to achieve the required thermal properties. In the embodiment shown, the bond pad 108 is integrated into the array, thereby providing an extremely compact configuration, while only slightly decreasing the power density of the device 100. As previously explained, the total output power for a power density and efficiency defined by the lateral $D_s$ and the pitch $D_p$—for a specified vertical VCSEL design and a corresponding process technology—may be adjusted by simply increasing the size of the array shown in FIG. 1c.

Figure 1D:
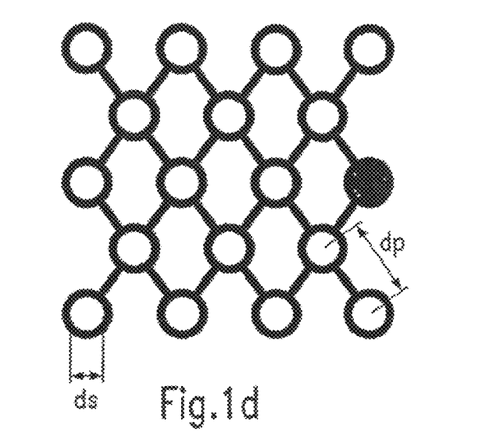

FIG. 1d schematically shows a top view of a further variant of the device 100, wherein the individual VCSEL elements are arranged according to a honeycombed pattern, including a bond pad on one lattice site, wherein inner VCSEL elements have four nearest neighbors. Regarding the metal interconnection and the provision of the bond pad within or without the VCSEL array, the same criteria as outlined with reference to FIG. 1c. In a preferred embodiment, the lattice defined by the VCSEL elements may be a hexagonal lattice so as to achieve a maximum number of 6 of nearest neighbors, thereby increasing power density and total output power for a given chip area.

The illustrative embodiments shown in FIGS. 1c and 1d use a substantial constant lateral size $D_s$ and a substantially constant pitch $D_p$, as this configuration simplifies the manufacturing process due to the simplicity of the lithographical mask.

Figure 1E:
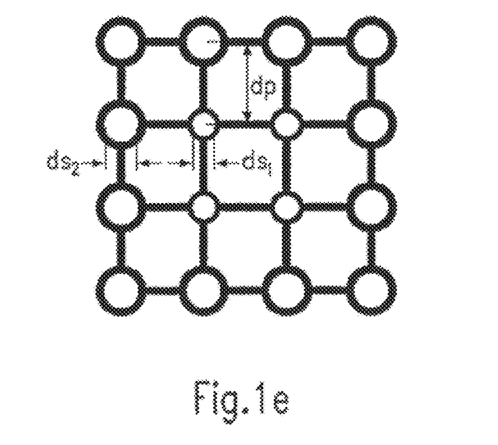

FIG. 1e shows an illustrative example in which the device 100 comprises VCSEL elements of different lateral sizes $D_{s1}$ and $D_{s2}$. For instance, in a specified application, the heat removal capability at the periphery of the device 100 may be enhanced compared to the center portion, wherein the center portion may therefore include devices with a reduced aperture size so as to enhance the efficiency and thereby reduce the heat generated during the operation of the device. The corresponding reduction of the power density of the device 100, and thus of the total output power when considered for a uniform temperature distribution across the device 100, may, however, possibly be compensated by the higher efficiency of the center portion during the actual operating conditions when the enhanced heat removal capability at the edge of the array may lead to a temperature gradient. It should be noted that the embodiment shown in FIG. 1e is of illustrative nature only, and various design possibilities may be performed so as to adapt a local power density within the array to specified application requirements. For instance, the lattice as shown in FIG. 1c may be "distorted" in conformity with design requirements, for example, in conformity with the heat removal capabilities of the specified application. Thereby, substantially the same lateral dimension $D_s$ may be used, or the lateral dimensions $D_s$ may be varied in accordance with the distortion of the lattice.

Figure 1F:
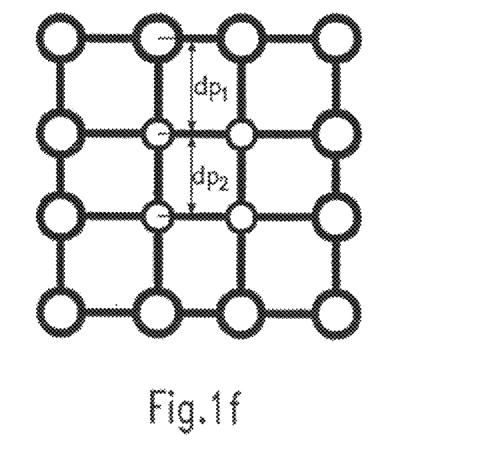

FIG. 1f representatively depicts the device 100 including an array of VCSEL elements wherein at an inner portion of the device 100 the lateral size $D_s$ and the pitch $D_p$ is different compared to elements positioned at the edge of the array. As stated above, in this way a non-uniform temperature distribution may be compensated or at least reduced.

As is evident from the above embodiments, the power density may be "locally" modified while still a desired minimum power density at an increased efficiency may be achieved. A corresponding local power density patterning may be advantageous in manufacturing large-area devices, possibly on a wafer scale, to thereby compensate for parameter variations that may not be relevant for small arrays including, for instance, 9 to 25 elements.

While the invention has been described with respect to the several preferred embodiments, variations and modification can be made without department from the spirit or scope of the invention.

What is claimed is:

1. A method of manufacturing a Vertical Cavity Surface Emitting Laser (VCSEL) array to a desired power density, comprising the steps of:

establishing, using a first VCSEL array including VCSEL elements, a relationship between an effective lateral size of a laser active region of the VCSEL elements, a pitch between center points of nearest neighbors of the VCSEL elements, and a power output by the first VCSEL array, determining data corresponding to a wall-plug efficiency of the first VCSEL array for a plurality of different pitches and effective lateral sizes, determining positions of VCSEL elements in a second VCSEL array on the basis of the relationship and the data, wherein a pitch between center points of nearest neighbors of the VCSEL elements in the second VCSEL array is equal to or less than 80 μm, and a first pitch between center points of a first VCSEL element in the second VCSEL array and a nearest neighbor thereto and a second pitch between center points of a second VCSEL element in the second VCSEL array and a nearest neighbor thereto are different, and manufacturing the second VCSEL array with the VCSEL elements substantially at the determined positions, wherein each of the VCSEL elements of the first VCSEL array and the second VCSEL array includes an effective laser active region with a defined center point and with an effective lateral size equal to or less than 30 μm.

2. The method of claim 1, further comprising the step of:

determining a desired range for the power density of the second VCSEL array based on an operating current range and a pitch of nearest neighbors determined by a selected manufacturing technology, wherein a maximum power density of the second VCSEL array operating within the operating current range is within the desired range for the power density of the second VCSEL array.

3. The method of claim 2, further comprising the step of:

determining a desired effective lateral size of the laser active region for said VCSEL elements of the second VCSEL array so as to obtain a power density that lies within the desired range for the power density.

4. The method of claim 3, wherein:

said step of manufacturing the second VCSEL array includes forming a current aperture to a desired size by selectively oxidizing a material layer to obtain a conductive non-oxidized layer portion as the current aperture.

5. The method of claim 3, wherein:

said step of manufacturing the second VCSEL array includes forming a current aperture to a desired size by modifying a material layer stack through ion implantation so as to obtain a conductive non-modified layer portion as the current aperture.

6. The method of claim 1, wherein:

the data are derived from measurement results obtained from the first VCSEL array.

7. A method of manufacturing a Vertical Cavity Surface Emitting Laser (VCSEL) array to a desired power density, comprising the steps of:

establishing, using a first VCSEL array including VCSEL elements, a relationship between an effective lateral size of a laser active region of the VCSEL elements, a pitch between center points of nearest neighbors of the VCSEL elements, and a power output by the first VCSEL array, estimating a heat distribution of the second VCSEL array for predefined operating conditions and selecting the pitches and/or the effective lateral sizes for the VCSEL elements in the second VCSEL array on the basis of the estimated heat distribution, determining positions of VCSEL elements in a second VCSEL array on the basis of the relationship and the estimated heat distribution, wherein a pitch between center points of nearest neighbors of the VCSEL elements in the second VCSEL array is equal to or less than 80 μm, and a first pitch between center points of a first VCSEL element in the second VCSEL array and a nearest neighbor thereto and a second pitch between center points of a second VCSEL element in the second VCSEL array and a nearest neighbor thereto are different, and manufacturing the second VCSEL array with the VCSEL elements substantially at the determined positions, wherein each of the VCSEL elements of the first VCSEL array and the second VCSEL array includes an effective laser active region with a defined center point and with an effective lateral size equal to or less than 30 μm.

8. The method of claim 7, wherein:

the pitch for VCSEL elements in the second VCSEL array that are to be positioned in an area of increased temperature is greater than the pitch for VCSEL elements in the first VCSEL array that are to be positioned in an area of reduced temperature.

9. The method of claim 7, wherein:

the lateral size for VCSEL elements in the second VCSEL array that are to be positioned in an area of increased temperature is greater than the lateral size for VCSEL elements in the first VCSEL array that are to be positioned in an area of reduced temperature.

* * * * *